United States Patent
Teraoka

(10) Patent No.: US 7,675,664 B2
(45) Date of Patent: Mar. 9, 2010

(54) RECORDING MEDIUM, REPRODUCING APPARATUS, AND REPRODUCING METHOD

(75) Inventor: Yoshiyuki Teraoka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/013,994

(22) Filed: Jan. 14, 2008

(65) Prior Publication Data

US 2008/0180769 A1    Jul. 31, 2008

Related U.S. Application Data

(62) Division of application No. 11/415,157, filed on May 2, 2006.

(30) Foreign Application Priority Data

May 20, 2005  (JP)  ............................. 2005-148420

(51) Int. Cl.
*G03H 1/26* (2006.01)
*G03H 1/02* (2006.01)
*G03H 1/22* (2006.01)

(52) U.S. Cl. .............................. 359/22; 359/28; 359/32
(58) Field of Classification Search .................... 359/10
See application file for complete search history.

(56) References Cited

U.S. PATENT DOCUMENTS

| 2003/0090969 A1* | 5/2003 | Matsumoto et al. ....... 369/44.34 |
| 2004/0145994 A1* | 7/2004 | Tsukagoshi ................. 369/103 |
| 2004/0179251 A1* | 9/2004 | Anderson et al. .............. 359/3 |

OTHER PUBLICATIONS

U.S. Appl. No. 12/014,005, filed Jan. 14, 2008, Teraoka.

* cited by examiner

*Primary Examiner*—Stephone B Allen
*Assistant Examiner*—Jade R Callaway
(74) *Attorney, Agent, or Firm*—Oblon, Spivak, McClelland, Maier & Neustadt, L.L.P.

(57) ABSTRACT

A recording medium records therein image data for distributing contents as element holograms with interference fringes generated by interference between an object beam representing the image data and a reference beam. The image data to be distributed which are recorded as the element holograms in the recording medium are reproduced by applying reference beams to the recording medium.

10 Claims, 9 Drawing Sheets

RECORDING DATA

FOURIER IMAGE

REPRODUCED IMAGE

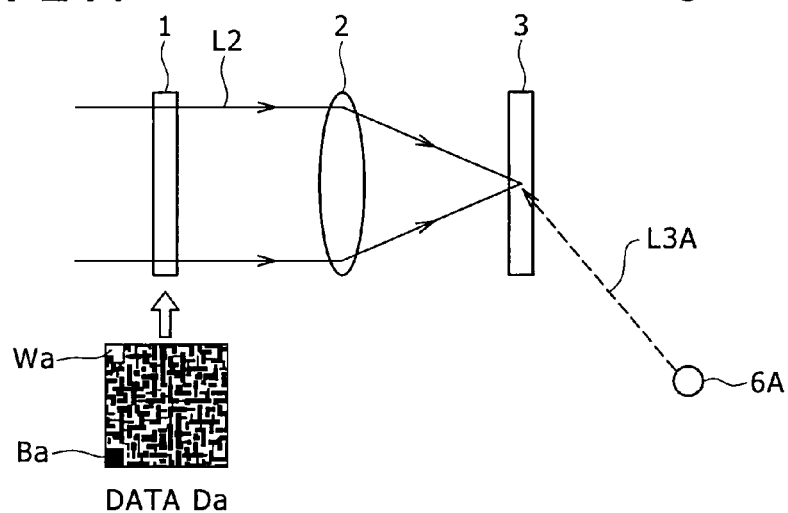
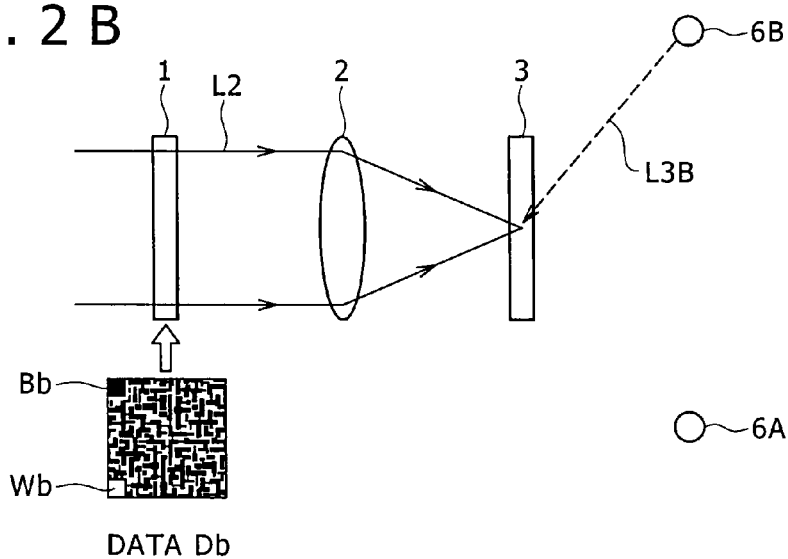
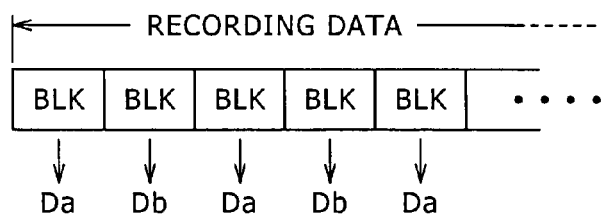

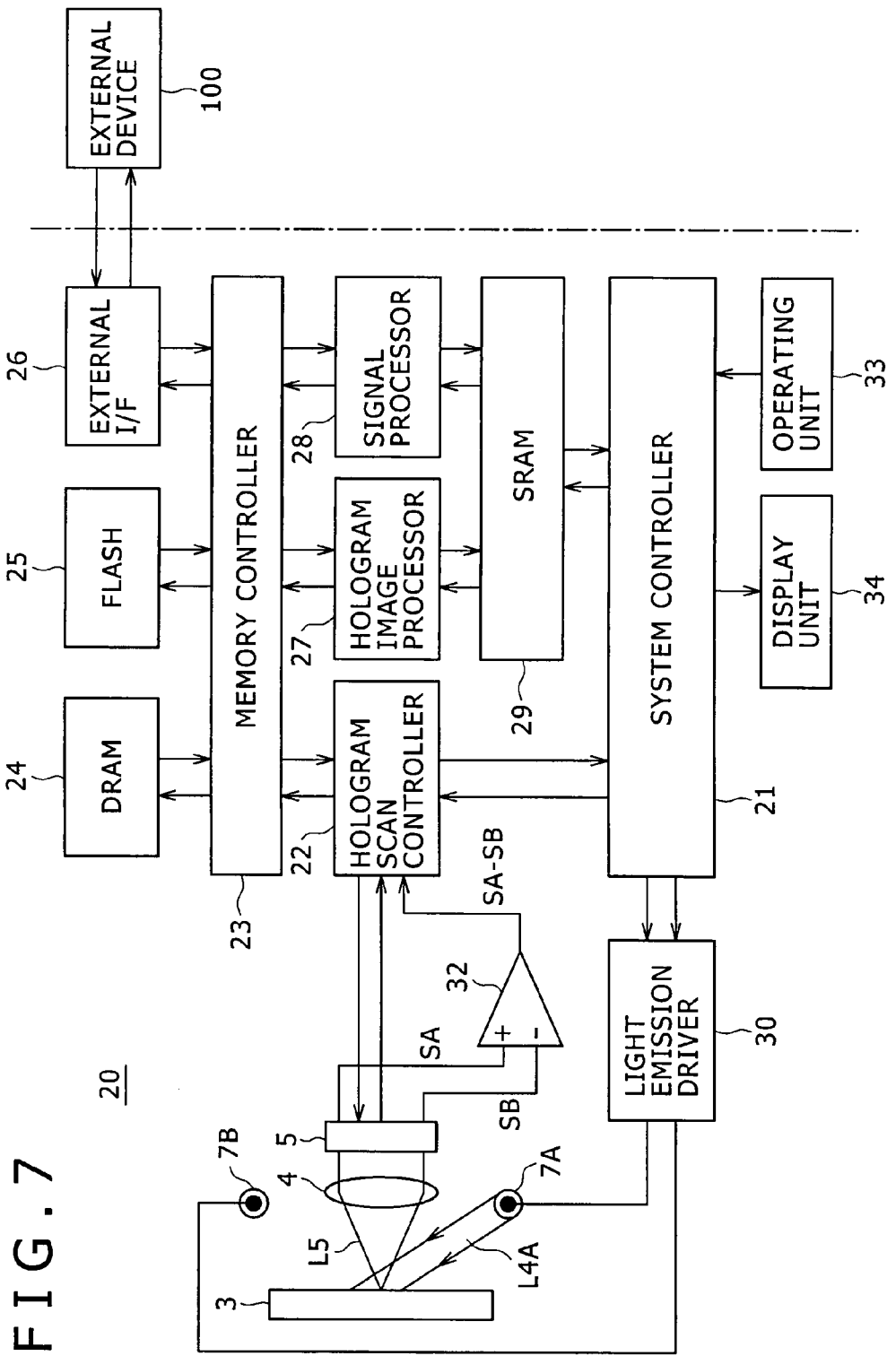

SA

SB

SA-SB

LIGHT SOURCE 7A

LIGHT SOURCE 7B

LIGHT EMISSION PERIOD

DATA READING TIMING

RECORDING MEDIUM, REPRODUCING APPARATUS, AND REPRODUCING METHOD

CROSS REFERENCES TO RELATED APPLICATIONS

This application is a divisional of application Ser. No. 11/415,157, filed May 2, 2006, which claims priority under 35 U.S.C. 119 to Japanese Patent Application JP 2005-148420 filed in the Japanese Patent Office on May 20, 2005, the entire contents of both of which are being incorporated herein by reference.

BACKGROUND OF THE INVENTION

The present invention relates to a recording medium in the form of a hologram for recording data based on fringes produced by interference between an object beam from an image representing the data and a reference beam, and an apparatus for and a method of reproducing data recorded in the recording medium.

There are known in the art holographic recording mediums for recording various data based on fringes produced by interference between an object beam and a reference beam. It is also known in the art that the holographic recording mediums can have a high recording density for large storage capacity. The holographic recording mediums are considered to be useful as large-capacity storage mediums for storing computer data and AV (Audio-Video) contents data such as audio and video data, for example.

For recording data in a holographic recording medium, the data is converted into image data as two-dimensional page data. The data is displayed on a liquid crystal panel or the like, and a light beam that has passed through the liquid crystal panel, i.e., an object beam representing an image of the two-dimensional page data, is applied to the holographic recording medium. In addition, a reference beam is applied at a certain angle to the holographic recording medium. The object beam and the reference beam interfere with each other, producing fringes that can be recorded as a single element hologram. Therefore, a single element hologram is a recorded form of one two-dimensional page data.

Japanese patent laid-open No. 2005-32308 discloses an optical information recording process for achieving a large storage capacity on a holographic recording medium according to shift multiplexing and angle multiplexing. According to shift multiplexing, a colinear optical system is used to convert a reference beam into a convergent (or divergent) beam for recording a succession of overlapping element holograms on the holographic recording medium for an increased recording density. According to angle multiplexing, the angle of a reference beam is changed to record a number of overlapping element holograms at the same position on the holographic recording medium for an increased recording density.

SUMMARY OF THE INVENTION

There is assumed a system employing a hologram memory in the shape of a sheet for recording computer data or AV contents data. In the system, the general user acquires the data recorded in the hologram memory with a reproducing apparatus serving as a hologram reader. The sheet-like hologram memory serves to record an array of closely packed element holograms on a flat medium surface thereof. The hologram reader is positioned in confronting relation to the medium surface for reading the data recorded as the element holograms from the hologram memory. Such a system is required to have the following features:

The hologram memory should have a certain large storage capacity.

The hologram memory should easily be duplicated into a large number of copies.

The hologram reader should be available inexpensively to the user and should have a simple makeup.

The hologram reader should be able to reproduce recorded data stably.

Hologram memories that have heretofore been available in the art suffer the following problems: According to shift multiplexing and angle multiplexing referred to above, the hologram memories can have a storage capacity having a sufficiently large level, i.e., are considered to be able to store data of the order of terabytes. However, the system for providing the general user with computer data and AV contents data does not require hologram memories to have such a very large storage capacity. The existing hologram memories can have a storage capacity large enough to store computer data and AV contents data without the need for shift multiplexing and angle multiplexing. In addition, the shift multiplexing and angle multiplexing processes make it difficult to manufacture hologram readers inexpensively in a simple structure as the processes require reproducing apparatus compatible with them. For example, if data is recorded in a hologram memory according to the angle multiplexing process, then the hologram reader needs to have a structure for applying a reproducing reference beam at various angles to the hologram memory, and hence is large in size and high in cost. The shift multiplexing process is also disadvantageous in that it is difficult to produce a large number of duplicates according to a contact copying process. Though shift multiplexing and angle multiplexing are useful for a system with a very large storage capacity, they are not suitable for a system for distributing a large number of hologram memories to easily provide various data to the general user.

One solution is to record element holograms unoverlappingly on a planar hologram memory not based on shift multiplexing and angle multiplexing. Factors that are to be taken into account in such a recording process are a certain recording density, i.e., a storage capacity, and a crosstalk problem. For recording element holograms unoverlappingly on a planar hologram memory with an object beam and a reference beam applied at a certain angle, adjacent ones of the element holograms need to be spaced a sufficient distance from each other in order to reduce crosstalk which occurs when the recorded element holograms are read. If data is to be read from a hologram memory which stores an array of closely packed element holograms, then certain identification patterns may be embedded in the patterns of the respective element holograms, and a signal indicative of the positional relationship between the element holograms may be extracted from the identification patterns as a servo signal. Conversely, if element holograms are positioned at sufficiently spaced intervals for reducing crosstalk, then an intermittent signal is produced from the identification patterns and such an intermittent signal is not appropriate as a servo signal.

According to the present invention, there are provided a recording medium using holograms for achieving a certain storage capacity without suffering crosstalk problems, and an apparatus for and a method of stably reproducing recorded data from such a recording medium using holograms with a simple arrangement.

Specifically, there is provided in accordance with the present invention a recording medium for recording image data as element holograms with interference fringes generated by interference between an object beam representing the image data and a reference beam, including a first element hologram formed by interference fringes generated by interference between an object beam representing first data and a first reference beam applied at a first angle, and a second element hologram formed by interference fringes generated by interference between an object beam representing second data and a second reference beam applied at a second angle which is different from the first angle, the second element hologram overlapping the first element hologram such that the first element hologram has a portion remaining unoverlapped by the second element hologram.

According to the present invention, there is also provided an apparatus for reproducing data from a recording medium which records therein a first element hologram formed by interference fringes generated by interference between an object beam representing first data and a first reference beam applied at a first angle, and a second element hologram formed by interference fringes generated by interference between an object beam representing second data and a second reference beam applied at a second angle which is different from the first angle, the second element hologram overlapping the first element hologram such that the first element hologram has a portion remaining unoverlapped by the second element hologram, the apparatus including a reference beam applying means for applying reference beams to the recording medium respectively at the first angle and the second angle, a reproduced image detecting means for detecting hologram images reproduced from the recording medium which is irradiated with the reference beams applied by the reference beam applying means and outputting reproduced image signals representing the hologram images, a signal reading means for reading the reproduced image signals representing the hologram images detected by the reproduced image detecting means, a timing detecting means for detecting scanning times for scanning the element holograms recorded in the recording medium from the reproduced image output from the reproduced image detecting means when the recording medium is irradiated with the reference beams at the first angle and the second angle, and a control means for controlling the reference beam applying means to apply the reference beams at the respective angles corresponding to the element holograms at the scanning times detected by the timing detecting means, and controlling the reproduced image detecting means to detect and reproduce hologram images from the recording medium in response to the applied reference beams.

According to the present invention, there is further provided a method of reproducing data from a recording medium which records therein a first element hologram formed by interference fringes generated by interference between an object beam representing first data and a first reference beam applied at a first angle, and a second element hologram formed by interference fringes generated by interference between an object beam representing second data and a second reference beam applied at a second angle which is different from the first angle, the second element hologram overlapping the first element hologram such that the first element hologram has a portion remaining unoverlapped by the second element hologram, the method including the steps of simultaneously applying reference beams to the recording medium respectively at the first angle and the second angle, detecting hologram images reproduced from the recording medium which is irradiated with the reference beams and outputting reproduced image signals representing the hologram images, reading the reproduced image signals representing the hologram images which are detected, detecting scanning times for scanning the element holograms recorded in the recording medium from the reproduced image signals which are read, and applying the reference beams at the respective angles corresponding to the element holograms at the scanning times which are detected, and detecting and reproducing hologram images from the recording medium in response to the applied reference beams.

The reproducing apparatus reads element holograms each representing two-dimensional page data from the hologram recording medium to provide reproduced data. The recording medium, the recording apparatus, and the recording method according to the present invention make it possible to provide a storage medium system having a relatively large storage capacity for providing computer data and AV contents data. As the distance between element holograms is reduced, the recording density is increased. If the reference beam spot is greater than an element hologram in reproducing recorded data therefrom, then a reproduced image of an adjacent element hologram tends to be also detected, resulting in crosstalk. Attention is drawn to the fact that a reproduced image of a recorded element hologram is obtained from a hologram memory when a reference beam is applied to the element hologram at the same angle as when a reference beam is applied to record the element hologram. If element holograms recorded by recording reference beams applied at different angles are positioned adjacent to each other in the hologram recording medium, then the recording density can be increased while reducing crosstalk between the adjacent element holograms. Specifically, the recording density is increased and the crosstalk is reduced if element holograms of different types ranging from the first type to the nth type are successively recorded in overlapping relation with each element hologram having an unoverlapping area not overlapping other element holograms. The reproducing apparatus for reading data from the hologram recording medium with the element holograms being thus recorded therein has a plurality of reference beam applying means for applying a plurality of reference beams, and controls the times to energize the reference beam applying means to read crosstalk-free or low-crosstalk signals from the element holograms. The reproducing apparatus is also capable of detecting signals representing the positional relationship between the element holograms and generating an appropriate timing signal.

Since the hologram recording medium according to the present invention can greatly reduce crosstalk from adjacent element holograms, the hologram recording medium may be constructed as a high-density hologram array and allow a servo signal indicative of the distance between adjacent element holograms, the direction thereof, and scanning times thereof to be read with ease. Because the reproducing apparatus has the plural reference beam applying means for applying a plurality of reference beams, and controls the times to energize the reference beam applying means to read crosstalk-free or low-crosstalk signals from the element holograms. As the reproducing apparatus is also capable of detecting signals representing the positional relationship between the element holograms, it can generate an appropriate timing signal. The hologram recording medium with the element holograms recorded therein according to the present invention can easily be duplicated into a large number of copies according to a contact copying process.

According to the present invention, therefore, the hologram recording medium can have a certain large storage capacity and can easily be duplicated into a large number of copies, the reproducing apparatus can have a simple makeup and is able to reproduce recorded data stably. The reproducing apparatus is suitable for use in a system wherein computer data and AV contents data are recorded in the hologram recording medium, such hologram recording mediums are widely distributed, and the general user acquires the data recorded in the hologram recording medium using the reproducing apparatus.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 2A is a schematic view showing a recording process which employs a first reference beam for recording data in the hologram memory according to the embodiment;

FIG. 2B is a schematic view showing a recording process which employs a second reference beam for recording data in the hologram memory according to the embodiment;

FIG. 2C is a schematic view showing the manner in which data are divided into blocks when the data is recorded in the hologram memory according to the embodiment;

FIG. 7 is a block diagram of a hologram reader according to an embodiment of the present invention;

DETAILED DESCRIPTION OF THE PREFERRED EMBODIMENTS

The embodiments of the present invention will be described below in the following order of topics:

[1. Recording and reproducing process of hologram memory]
[2. Hologram memory according to the embodiment]
[3. Reproducing apparatus arrangement]
[4. Reproducing operation on hologram memory]

[1. Recording and Reproducing Process of Hologram Memory]

Figure 1A:
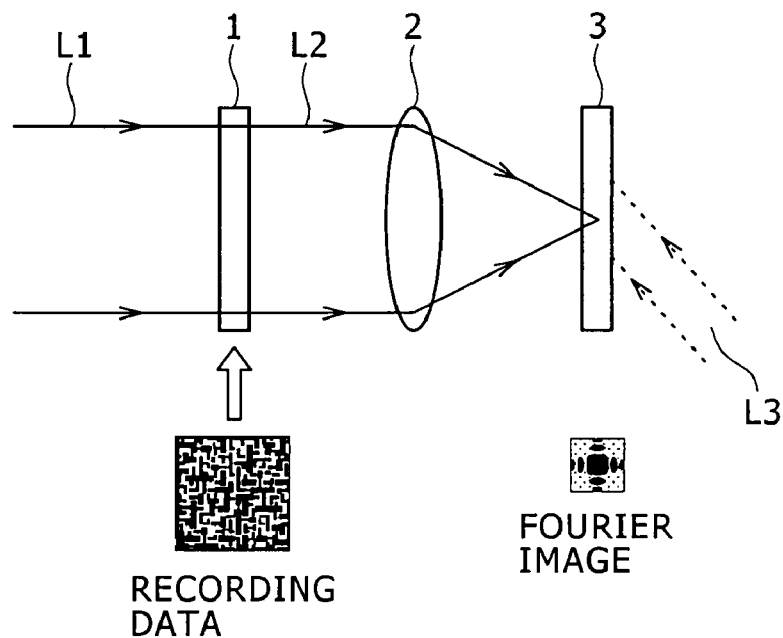
FIG. 1A is a schematic view showing the principles of a recording process of a hologram memory according to an embodiment of the present invention.

A basic recording and reproducing process of a hologram memory 3 according to an embodiment will be described below with reference to FIGS. 1A and 1B. FIG. 1A shows the manner in which data is recorded in the hologram memory 3. The data to be recorded is converted into image data in the form of a two-dimensional bar code, for example, as shown, and displayed as a two-dimensional page data image on a liquid crystal panel 1. When a laser beam L1 output from a predetermined light source and converted into a parallel beam passes through the liquid crystal panel 1 with the two-dimensional page data image being displayed thereon, it is converted into an object beam L2 representing the two-dimensional page data image. The object beam L2 is focused by a condenser lens 2 into a spot on the hologram memory 3. At this time, the hologram memory 3 is irradiated with a recording reference beam L3 at a certain angle. The object beam L2 and the reference beam L3 interfere with each other, producing interference fringes which are recorded as an element hologram. With the condenser lens 2 being used, the data recorded as the element hologram is represented by a Fourier image of the recorded data according to the Fourier transform action of the condenser lens 2.

Figure 1B:
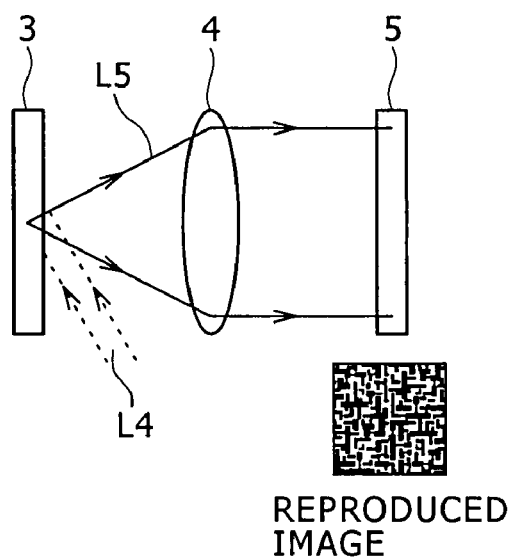
FIG. 1B is a schematic view showing the principles of a reproducing process of the hologram memory according to the embodiment of the present invention.

The element hologram recorded in the hologram memory 3 is reproduced as shown in FIG. 1B. A collimator lens 4 and an imager 5 shown in FIG. 1B are provided in a reproducing apparatus that serves as a hologram reader. The hologram memory 3 is irradiated with a reproducing reference beam L4 at the same angle as when the element hologram recorded in the hologram memory 3. When the hologram memory 3 is irradiated with the reproducing reference beam L4, it produces a reproduced image recorded as the element hologram. Specifically, the two-dimensional page data image appears at a position which is in conjugate relationship to the liquid crystal panel 1 used for recording the element hologram. The two-dimensional page data image that has appeared is read by the imager 5. Specifically, a reproduced image beam L5 from the hologram memory 3 is converted by the collimator lens 4 into a parallel beam, which is applied to the imager 5 that includes a CCD imaging device array or a CMOS imaging device array. Since the Fourier image on the hologram memory 3 is inversely Fourier-transformed by the collimator lens 4 into a two-dimensional page data image, the reproduced image as the two-dimensional page data image is read by the imager 5. The imager 5 generates a reproduced image signal as an electric signal depending on the reproduced image. The reproduced image signal is decoded into the original data, i.e., the data prior to being converted into the two-dimensional page data for recording.

[2. Hologram Memory According to the Embodiment]

The hologram memory 3 according to the present embodiment which performs the above basic recording and reproducing process will be described below. FIGS. 2A through 2C show the manner in which data is recorded. For recording data, a recording optical system is provided which includes light sources and optical system components, not shown, other than the liquid crystal panel 1 and the condenser lens 2. Recording reference beams L3A, L3B from light source positions 6A, 6B are applied at respective different angles to the hologram memory 3. The light source positions 6A, 6B are positions from which reference beams are applied to the hologram memory 3 by the recording optical system, and do not require respective different light source devices to be disposed in those positions.

According to the embodiment, data to be recorded, each in the form of a data block as two-dimensional page data, are successively sorted alternately as data of a first type (data Da) and data of a second type (data Db). For example, as shown in FIG. 2C, recording data as computer data or AV contents data are divided into data blocks BLK each made up of given bytes (x bytes), and each of the data blocks BLK is encoded into two-dimensional page data so as to be finally recorded as an element hologram in the hologram memory 3. When the data blocks BLK are encoded into two-dimensional page data, they are sorted alternately as data of the first type and data of the second type such that the first data block BLK of x bytes is sorted as data Da, the second data block BLK as data Db, the third data block BLK as data Da, etc. The data blocks BLK may not necessarily be sorted in a certain sequence. When the data Da is encoded into two-dimensional page data, as shown in FIG. 2A, a white area Wa and a black area Ba are provided as identification marks respectively in upper and lower left corners of an image represented by the data Da. When the data Db is encoded into two-dimensional page data, as shown in FIG. 2B, a black area Bb and a white area Wb are provided as identification marks respectively in the upper and lower left corners of an image represented by the data Db.

At the time of recording the data of the data block BLK sorted as data Da, as shown in FIG. 2A, the two-dimensional page data of the data Da is supplied to the liquid crystal panel 1, which displays a two-dimensional page data image. At this time, the object light L2 representing the two-dimensional page data image passes through the liquid crystal panel 1 and is focused by the condenser lens 2 as a beam spot onto the hologram memory 3. At this time, a recording reference beam L3A is applied from the light source position 6A at a first angle to the hologram memory 3. The recording reference beam L3A and the object beam L2 interfere with each other, producing interference fringes that are recorded as an element hologram with regard to the data Da (an element hologram of a first type) in the hologram memory 3.

At the time of recording the data of the data block BLK sorted as data Db, as shown in FIG. 2B, the two-dimensional page data of the data Db is supplied to the liquid crystal panel 1, which displays a two-dimensional page data image. At this time, the object light L2 representing the two-dimensional page data image passes through the liquid crystal panel 1 and is focused by the condenser lens 2 as a beam spot onto the hologram memory 3. At this time, a recording reference beam L3B is applied from the light source position 6B at a second angle to the hologram memory 3. The recording reference beam L3B and the object beam L2 interfere with each other, producing interference fringes that are recorded as an element hologram with regard to the data Db (an element hologram of a second type) in the hologram memory 3.

In this manner, the data Da, Db are alternately recorded in the hologram memory 3 while the recording reference beams L3A, L3B are being alternately applied to the hologram memory 3. At this time, the hologram memory 3 (hologram material) is positionally displaced (or the recording optical mechanism is positionally displaced) by a displacing mechanism, not shown, to record successive element holograms at slightly displaced positions on the surface of the hologram memory 3. Therefore, element holograms of the first type with regard to the data Da and element holograms of the second type with regard to the data Db are successively recorded in the hologram memory 3 with the element holograms of the first and second types partly overlapping and unoverlapping each other.

Figure 3A:
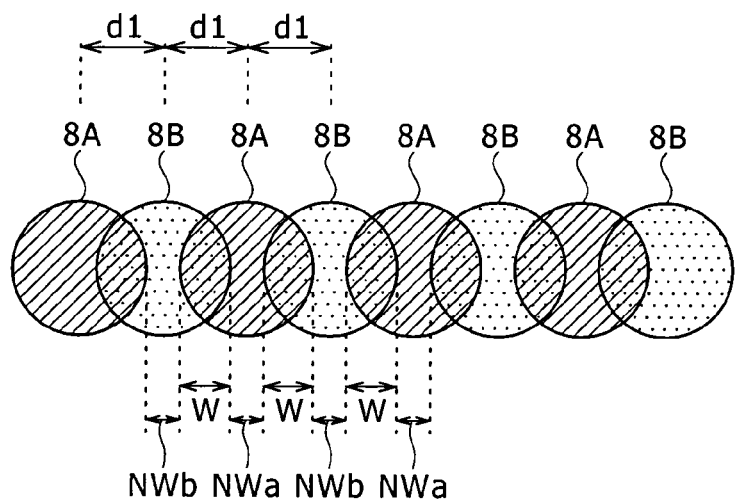
FIG. 3A is a schematic view showing a linear array of element holograms recorded in the hologram memory according to the embodiment.

FIG. 3A shows the manner in which element holograms 8A of the first type based on the data Da and element holograms 8B of the second type based on the data Db are successively recorded in a linear array in the hologram memory 3. When the element holograms 8A, 8B are successively recorded in the hologram memory 3, the beam spot of the object beam L2 applied to the hologram memory 3 and the hologram memory 3 are relatively displaced by a distance d1 at a time. At this time, adjacent ones of the element holograms 8A, 8B overlap each other in an overlapping area W and have respective unoverlapping areas NWa, NWb. The unoverlapping area NWa of each element hologram 8A does not overlap an adjacent element hologram 82, and the unoverlapping area NWb of each element hologram 8b does not overlap an adjacent element hologram 8A.

Figure 3B:
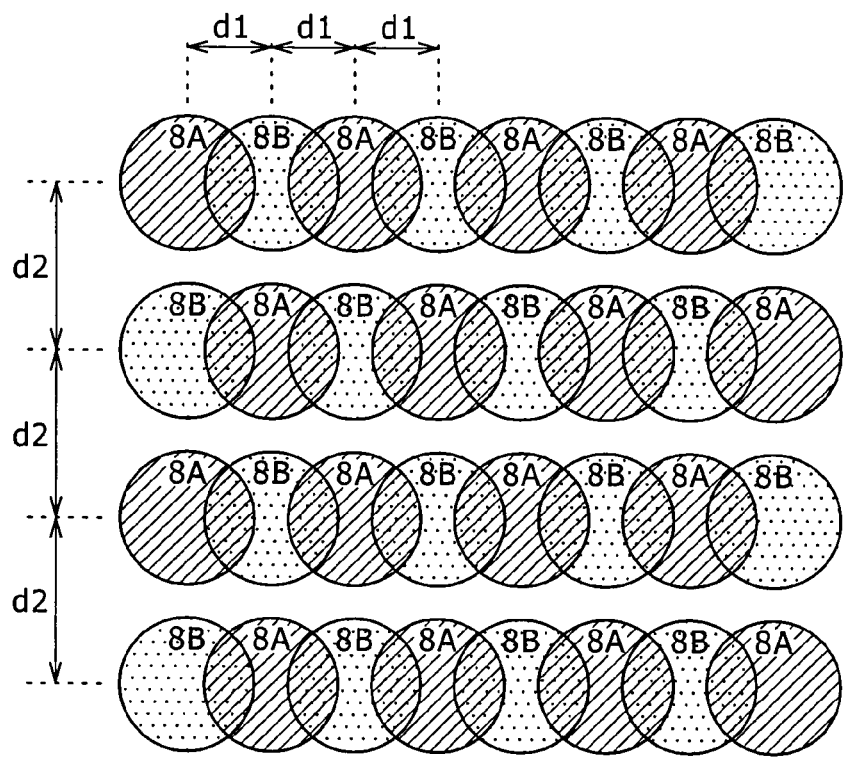
FIG. 3B is a schematic view showing a two-dimensional array of element holograms recorded in the hologram memory according to the embodiment.

For recording element holograms 8A, 8B as shown in FIG. 3A on the two-dimensional surface of the hologram memory 3, the element holograms 8A, 8B are produced in successive rows spaced by a distance d2 as shown in FIG. 3B, such that adjacent ones of the element holograms 8A, 8B in each row overlap each other in the overlapping area W and have the respective unoverlapping areas NWa, NWb. It is preferable that the element holograms 8A, 8B in adjacent ones of rows be held out of alignment with each other, i.e., element holograms of identical types be not positioned adjacent to each other vertically in FIG. 3B.

If the hologram memory 3 is in the form of a disc for recording element holograms 8A, 8B along circumferential tracks on the hologram memory 3, then the element holograms 8A, 8B may be recorded in the format shown in FIG. 3A. If the hologram memory 3 is in the form of a card or a sheet for recording element holograms 8A, 8B as a two-dimensional array on the two-dimensional surface of the hologram memory 3, then the element holograms 8A, 8B may be recorded in the format shown in FIG. 3B.

The element holograms 8A, 8B recorded in the hologram memory 3 are reproduced as follows: For reproducing the element holograms 8A, 8B that are recorded in the hologram memory 3 as shown in FIGS. 3A and 3B, the hologram reader applies reproducing reference beams at the same angles as the recording reference beams L3A, L3B and reads a reproduced image generated from the hologram memory 3.

Figure 4A:
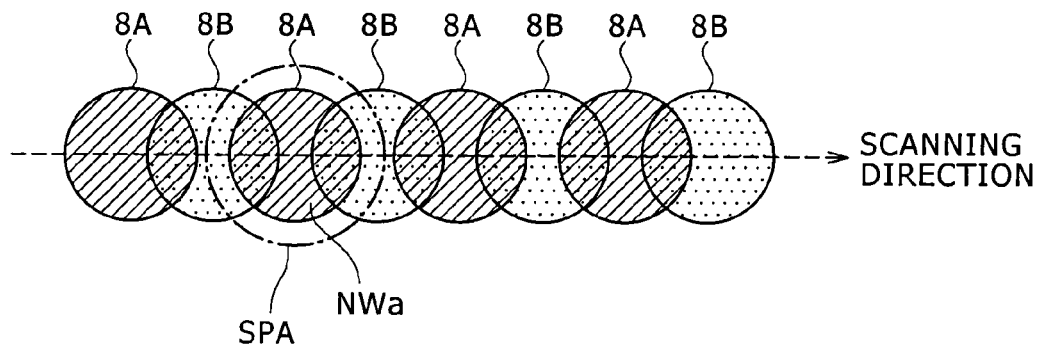
FIG. 4A is a schematic view showing the relationship between element holograms recorded in the hologram memory according to the embodiment and a first reproducing reference beam spot.
Figure 4B:
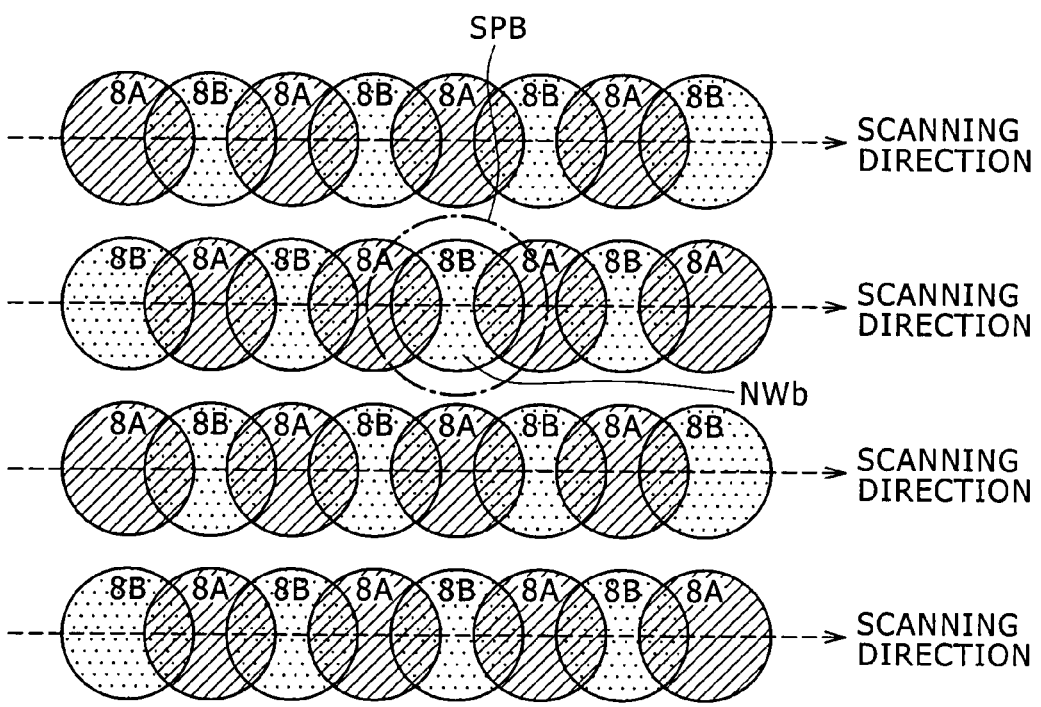
FIG. 4B is a schematic view showing the relationship between element holograms recorded in the hologram memory according to the embodiment and a second reproducing reference beam spot.

FIGS. 4A and 4B show the beam spots of reproducing reference beams applied to the hologram memory 3. FIG. 4A shows the beam spot SPA of a reproducing reference beam that is applied at the same angle as the recording reference beam L3A. The beam spot SPA has a diameter equal to or greater than the diameter of the element holograms 8A, 8B, i.e., has a size large enough to read an overall reproduced image of one element hologram 8A. Furthermore, when the beam spot SPA is applied in coaxial alignment with the unoverlapping area NWa of a certain element hologram 8A, the beam spot SPA is of a size not large enough to reach left and right element holograms 8A that are positioned across two element holograms 8B adjacent to that certain element hologram 8A. Though not shown, the beam spot SPB of a reproducing reference beam that is applied at the same angle as the recording reference beam L3B has the same size as the beam spot SPB.

FIG. 4B shows the beam spot SPB of a reproducing reference beam that is applied at the same angle as the recording reference beam L3B. The beam spot SPB has the same size as described above with reference to FIG. 4A with respect to a scanning direction. Specifically, when the beam spot SPB is applied in coaxial alignment with the unoverlapping area NWb of a certain element hologram 8B, the beam spot SPB is of a size not large enough to reach left and right element holograms 8B that are positioned across two element holograms 8A adjacent to that certain element hologram 8B in the scanning direction. Furthermore, the beam spot SPB is of a size not large enough to reach element holograms 8B in vertically adjacent rows in FIG. 4B. Though not shown, the beam spot SPB of a reproducing reference beam that is applied at the same angle as the recording reference beam L3A has the same size as the beam spot SPA.

Stated otherwise, the distances by which the beam spot and the hologram memory 3 are relatively displaced when the element holograms 8A, 8B are recorded as shown in FIGS. 3A, 3B, i.e., the distances d1, d2 by which the element holograms 8A, 8B are spaced, are selected in view of the relationship between the spot size and the size of the element holograms in order to produce the element holograms 8A, 8B and the beam spots SPA, SPB as shown in FIGS. 4A, 4B.

Figure 5A:
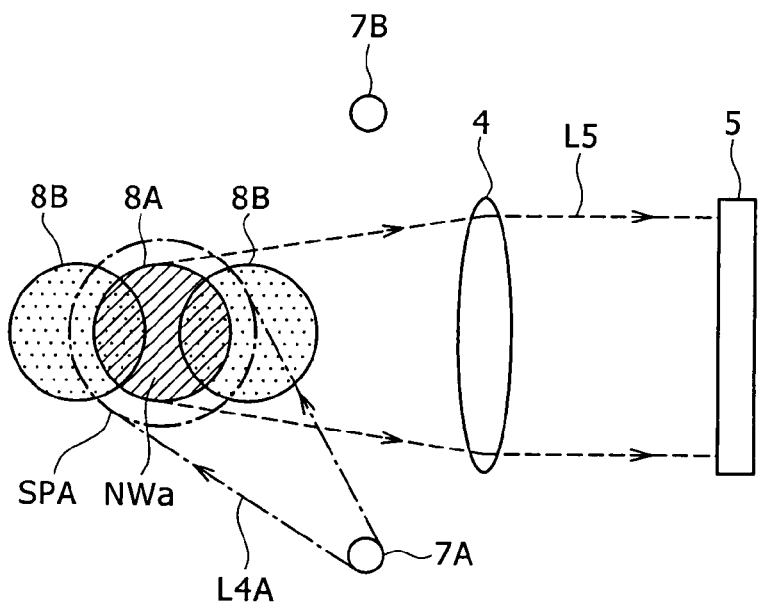
FIG. 5A is a schematic view showing the manner in which data is reproduced by a first reference beam when the hologram memory according to the embodiment operates in a data reproducing mode.
Figure 5B:
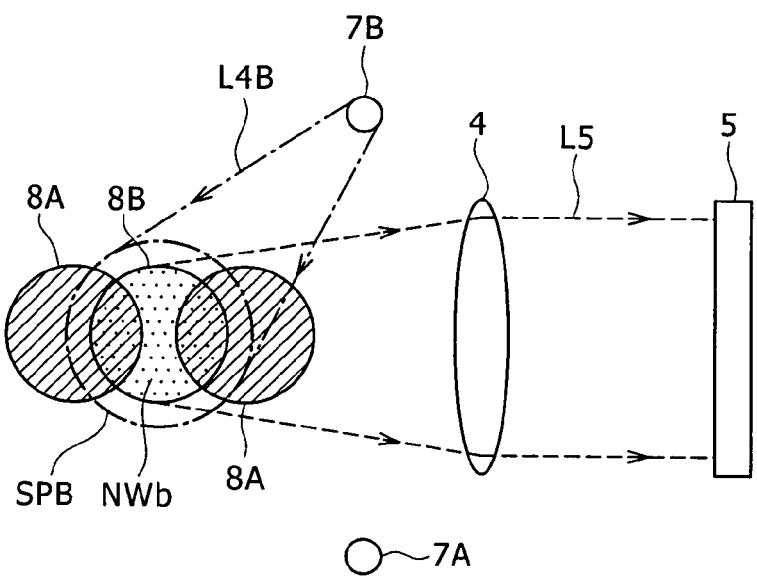
FIG. 5B is a schematic view showing the manner in which data is reproduced by a second reference beam when the hologram memory according to the embodiment operates in the data reproducing mode.

FIGS. 5A and 5B show the manner in which data of element holograms 8A, 8B are read, i.e., reproduced images of element holograms 8A, 8B are read. The hologram reader has a collimator lens 4 and an imager 5 for reading reproduced images, and reference light sources 7A, 7B for generating reproducing reference beams. The reference light source 7A applies a reproducing reference beam L4A to the hologram memory 3 at the same angle as the recording reference beam L3A. The reference light source 7B applies a reproducing reference beam L4B to the hologram memory 3 at the same angle as the recording reference beam L3B.

As shown in FIG. 5A, an element hologram 8A is scanned at the time when the beam spot SPA of the reproducing reference beam L4A covers the element hologram 8A in its entirety. Specifically, the beam spot SPA of the reproducing reference beam L4A has its center positioned near the center of the element hologram 8A. At this time, only the reference light source 7A is turned on, and the reference light source 7B is turned off. The beam spot SPA generates a reproduced image of the element hologram 8A, and the reproduced image is read by the imager 5 through the collimator lens 4. At this time, left and right element holograms 8B which partly overlap the element hologram 8A are element holograms that have been recorded by the recording reference beam L3B applied at an angle different from the angle of the reproducing reference beam L4A. Therefore, even though those left and right element holograms 8B include portions covered by the beam spot SPA, no reproduced images are generated from the element holograms 8B. Left and right element holograms 8A, not shown in FIG. 5A, that are positioned across those left and right element holograms 8B from the element hologram 8A are not positioned in the range of the beam spot SPA at this time, as can be understood from FIGS. 4A, 4B. Consequently, when the element hologram 8A is scanned as shown in FIG. 5A, only the reproduced image of the element hologram 8A can be read by the imager 5 with almost no crosstalk.

As shown in FIG. 5B, an element hologram 8B is scanned at the time when the beam spot SPB of the reproducing reference beam L4B covers the element hologram 8B in its entirety. Specifically, the beam spot SPB of the reproducing reference beam L4B has its center positioned near the center of the element hologram 8B. At this time, only the reference light source 7B is turned on, and the reference light source 7A is turned off. The beam spot SPB generates a reproduced image of the element hologram 8B, and the reproduced image is read by the imager 5 through the collimator lens 4. At this time, left and right element holograms 8A which partly overlap the element hologram 8B are element holograms that have been recorded by the recording reference beam L3A applied at an angle different from the angle of the reproducing reference beam L4B. Therefore, even though those left and right element holograms 8A include portions covered by the beam spot SPB, no reproduced images are generated from the element holograms 8A. Left and right element holograms 8B, not shown in FIG. 5B, that are positioned across those left and right element holograms 8A from the element hologram 8B are not positioned in the range of the beam spot SPB at this time, as can be understood from FIGS. 4A, 4B. Consequently, when the element hologram 8B is scanned as shown in FIG. 5B, only the reproduced image of the element hologram 8B can be read by the imager 5 with almost no crosstalk.

For obtaining a reproduced image of an element hologram, the reproducing reference beam spots SPA, SPB have to be a size equal to or greater than the size of the element hologram. Since the center of the element hologram and the center of the reference beam spots SPA, SPB may not necessarily be aligned with each other when the element hologram is scanned for reproducing data therefrom, the size of the reference beam spots SPA, SPB actually needs to be greater than the size of the element holograms. The element holograms 8A, 8B which are successively recorded while overlapping each other in the overlapping areas W and having the respective unoverlapping areas NWa, NWb contribute to the reduction of crosstalk. Specifically, because a certain distance is provided between element holograms in order to provide the unoverlapping area NWa, when the reference beam spot SPA is applied near the center of an element hologram 8A, even if the reference beam spot SPA is of a diameter greater than the diameter of the element hologram 8A, the reference beam spot SPA does not reach an element hologram 8A of the same type which is positioned across an element hologram 8B from the element hologram 8A.

The foregoing details will be summarized as follows: By successively recording element holograms based on two-dimensional page data in the hologram memory 3, a medium having a relatively large capacity for recording computer data and AV contents data is realized. As the distance between element holograms is reduced, the recording density is increased. If the reference beam spot is greater than an element hologram in reproducing recorded data therefrom, then a reproduced image of an adjacent element hologram tends to be also detected, resulting in crosstalk. This problem occurs also on Lippmann holograms employing a photopolymer or embossed holograms produced as CGH (Computer-Generated Holograms).

According to the present embodiment, attention is drawn to the fact that a reproduced image of a recorded element hologram is obtained when a reference beam is applied to the element hologram at the same angle as when a reference beam is applied to record the element hologram. If element holograms 8A, 8B recorded by recording reference beams L3A, L3B applied at different angles are positioned adjacent to each other in the hologram memory 3, then the recording density can be increased while reducing crosstalk between the adjacent element holograms. Specifically, when the element hologram 8A is to be reproduced, the reproducing reference beam L4A is used. Since the angle of the reproducing reference beam L4A is widely different from the angle of the recording reference beam L3B applied to record the element hologram 8B, no signal is reproduced from the element hologram 8B even if the reproducing reference beam L4A is applied to the element hologram 8B. Therefore, crosstalk is not increased even if the distance between adjacent holograms is increased. Furthermore, inasmuch as the size of the reproducing reference beam spots SPA, SPB, the size of the element holograms 8A, 8B, and the distances d1, d2 between the element holograms 8A, 8B are established as described above with reference to FIGS. 4A and 4B, only one element hologram 8A is covered by one reference beam spot SPA at a certain time. Stated otherwise, at the time when the center of the reference beam spot SPA is substantially aligned with the center of the element hologram 8A, no reproduced image is generated from other element holograms 8A of the same type. Accordingly, when a reproduced image is read at this time, almost no crosstalk is produced from other element holograms 8A.

According to the present embodiment, therefore, though the element holograms 8A, 8B are recorded in a high density, data essentially free of crosstalk can be read therefrom. The element holograms 8A, 8B are recorded overlappingly in the overlapping areas W. It has already been known in the art that if the hologram memory 3 is made of a photopolymer, then it is possible to record a plurality of element holograms overlappingly. Such overlapping recording is apparent because a plurality of element holograms are recorded overlappingly according to shift multiplexing and angle multiplexing as described above. For reading reproducing images of respective element holograms at times for eliminating crosstalk, the reproducing apparatus (hologram reader) needs to be able to determine those times (scanning times). The scanning times are determined using the identification marks described above. Specifically, the identification marks are provided as the white area Wa and the black area Ba in the two-dimensional page data referred to as the data Da, and as the black area Bb and the white area Wb in the two-dimensional page data referred to as the data Db. The identification marks will be described later with respect to a hologram reader, which will be described later with reference to FIGS. 7, 8, 9A through 9H as an embodiment of the reproducing apparatus.

According to the present embodiment, the element holograms 8A, 8B are recorded using the respective recording reference beams L3A, L3B. The hologram memory 3 can be copied into a large number of duplicates according to a contact copying process. Specifically, a hologram blank is held in close contact with the hologram memory 3 as a copy master, and a reference beam is applied to them at the same angle as the recording reference beam L3A to transfer the element holograms 8A from the copy master to the hologram blank and a reference beam is applied to them at the same angle as the recording reference beam L3B to transfer the element holograms 8B from the copy master to the hologram blank.

Figure 6A:
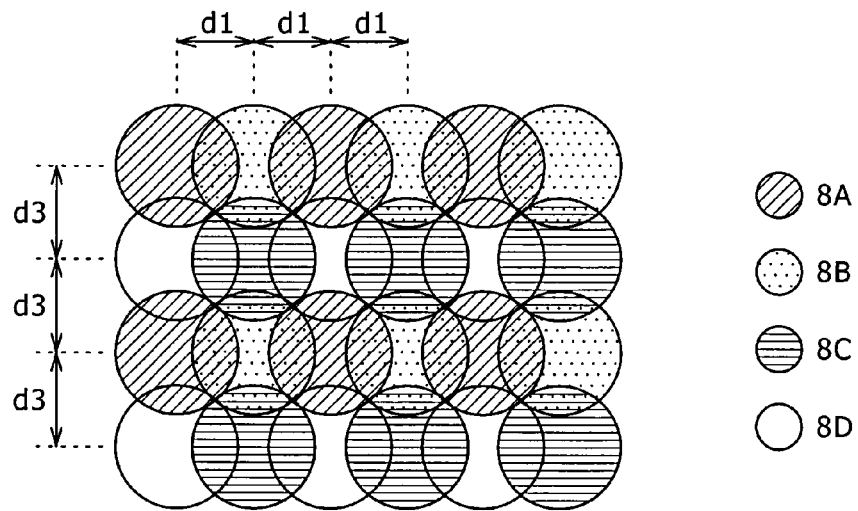
FIG. 6A is a schematic view showing a two-dimensional array of element holograms recorded in a hologram memory according to another embodiment of the present invention.
Figure 6B:
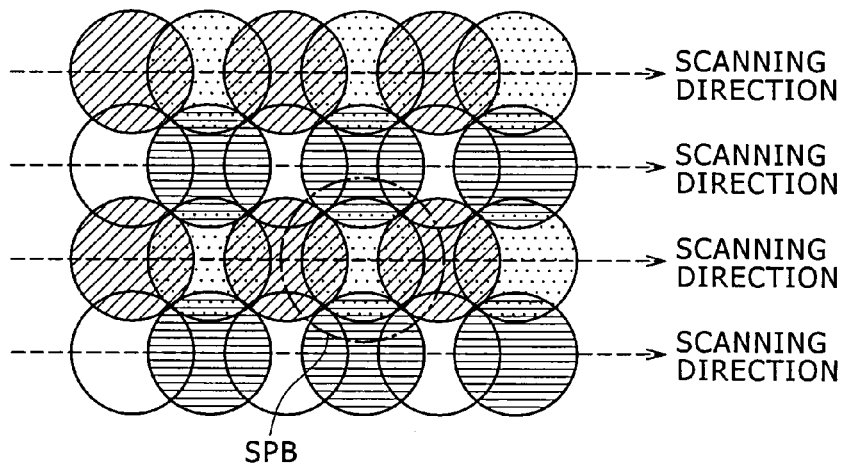
FIG. 6B is a schematic view showing the relationship element holograms in the hologram memory according to the other embodiment and a reference beam spot.
Figure 6C:
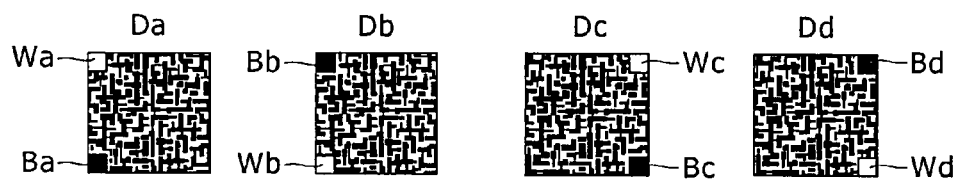
FIG. 6C is a schematic view showing the layout of identification information reproduced from element holograms in the hologram memory according to the other embodiment.

In the above embodiment, two recording reference beams L3A, L3B applied at different angles have been described as reference beams. However, it is also possible to use a greater number of reference beams at different angles. FIGS. 6A, 6B, and 6C show an example in which element holograms 8A, 8B, 8C, 8D of four types are recorded. Data to be recorded, each in the form of a data block as two-dimensional page data, as shown in FIGS. 2A, 2B, and 2C, are successively sorted alternately as data of a first type (data Da), data of a second type (data Db), data of a third type (data Dc), and data of a fourth type (data Dd). When the data Da is encoded into two-dimensional page data, as shown in FIG. 6C, a white area Wa and a black area Ba are provided as identification marks respectively in upper and lower left corners of an image represented by the data Da. When the data Db is encoded into two-dimensional page data, a black area Bb and a white area Wb are provided as identification marks respectively in the upper and lower left corners of an image represented by the data Db. When the data Dc is encoded into two-dimensional page data, a white area Wc and a black Bc are provided as identification marks respectively in the upper and lower right corners of an image represented by the data Dc. When the data Dd is encoded into two-dimensional page data, a black area Bd and a white area Wd are provided as identification marks respectively in the upper and lower right corners of an image represented by the data Dd.

Then, as with the linear array of element holograms shown in FIG. 3A, a linear array of element holograms 8A, 8B of the first and second types is recorded based on the data Da, Db. A recording reference beam is applied at a first angle to record the element holograms 8A, and a recording reference beam is applied at a second angle to record the element holograms 8B. Then, a next linear array of element holograms 8C, 8D of the third and fourth types is recorded based on the data Dc, Dd. A recording reference beam is applied at a third angle to record the element holograms 8C, and a recording reference beam is applied at a fourth angle to record the element holograms 8D. The linear arrays are recorded at a spaced distance d3 which is smaller than the spaced distance d2 shown in FIG. 3B. The above recording process is repeated to record the element holograms 8A, 8B, 8C, 8D as shown in FIG. 6A.

FIG. 6B shows a reference beam spot SPB for reproducing the element holograms 8B. As shown in FIG. 6B, at a certain time during the scanning process, i.e., when the center of the reference beam spot SPB is substantially aligned with the center of a certain element hologram 8B, other element holograms 8A, 8C, 8D are partly covered by the reference beam spot SPB, but other element holograms 8B of the same type are not covered by the reference beam spot SPB. Reproduced images of the other element holograms 8A, 8C, 8D are not regenerated by the reference beam spot SPB. Consequently, at the time shown in FIG. 6B, the reproduced image of only one element hologram 8B can be read without crosstalk. By recording the element holograms 8A, 8B, 8C, 8D with reference beams at respective four different angles, the distances d3 by which the linear arrays of element holograms are spaced can be made smaller for recording data at a higher packing density.

[3. Reproducing Apparatus Arrangement]

A hologram reader 20 as a reproducing apparatus for reproducing data recorded in the hologram memory 3 described above with reference to FIGS. 2A, 2B, 3A and 3B, according to the reproducing process described above with reference to FIGS. 4A, 4b and 5, will be described below.

First, structural details of the hologram reader, generally denoted by 20 in FIG. 7, will be described below with reference to FIG. 7. In FIG. 7, the hologram reader 20 has a system controller 21 including a microcomputer, for example, for controlling various components of the hologram reader 20 for reading recorded data from the hologram memory 3. The system controller 21 also monitors operating information from an operating unit 33 and controls various components of the hologram reader 20 based on operating actions of the user. The system controller 21 controls a display unit 34 to display various items of information to be presented to the user.

The hologram reader 20 has a collimator lens 4, an imager 5, and two reference beam sources 7A, 7B for reading recorded data from the hologram memory 3. The reference beam source 7A is located for emitting a reproducing reference beam L4A to the hologram memory 3 at the same angle as the recording reference beam L3A. The reference beam source 7B is located for emitting a reproducing reference beam L4B to the hologram memory 3 at the same angle as the recording reference beam L3B. The collimator lens 4 guides reproduced image light from the hologram memory 3 to the imager 5. The imager 5 includes a solid-state imaging device array such as a CMOS image sensor, a CCD image sensor, or the like. The imager 5 detects the reproduced image light applied through the collimator lens 4 and outputs an electric reproduced image signal representative of the reproduced image light.

The reference beam sources 7A, 7B, which may include LEDs (Light Emitting Diodes), are energized to emit light by a light emission driver 30. When the hologram reader 20 is to reproduce recorded data from the hologram memory 3, the light emission driver 30 turns on and off the reference beam sources 7A, 7B at predetermined respective times according to instructions from the system controller 21.

A hologram scan controller 22 controls operation of the imager 5 and processes the reproduced image signal generated by the imager 5. Specifically, the hologram scan controller 22 supplies the imager 5 with a transfer timing signal, a transfer address signal, etc. to successively transfer a reproduced image signal which is generated by the solid-state imaging device array during an image capturing process. The hologram scan controller 22 then performs various processing processes, including a sampling process, an AGC process, an A/D conversion process, etc. on the reproduced image signal transferred from the imager 5, and outputs the processed reproduced image signal.

The imager 5 supplies signals SA, SB from sensing areas thereof, which correspond to the identification marks assigned to the two-dimensional page data as described above, to a computing unit 32. The computing unit 32 supplies a differential signal (SA−SB) which represents the difference between the signals SA, SB through the hologram scan controller 22 to the system controller 21. As described later, the system controller 21 determining scanning times based on the differential signal (SA−SB), controls the hologram scan controller 22 to read reproduced image signals from the imager 5 and to store the read image signals into a DRAM (Dynamic Random Access Memory) 24, and also controls the reference beam sources 7A, 7B for emitting the reference beams.

The digital reproduced image signal output from the hologram scan controller 22 is stored in the DRAM 24 under the control of a memory controller 23. The memory controller 23 controls the transfer of data to be stored in the DRAM 24 and a flash memory 25, and also controls the writing and reading of data to and from the DRAM 24 and the flash memory 25. The reproduced image signal that is stored in the DRAM 24 is processed by a hologram image processor 27 and a signal processor 28. An SRAM (Static Random Access Memory) 29 is used to exchange the processed image signal and information required to process the image signal between the hologram image processor 27 and the signal processor 28, and the system controller 21. The flash memory 25 stores settings, coefficients, and various control parameters that are required for signal processing in the hologram image processor 27 and the signal processor 28.

The hologram image processor 27 corrects the reproduced image signal for optical distortions representing data variations due to optical reasons, adjusts the brightness of the reproduced image signal, corrects the reproduced image signal for image position displacements, and corrects the reproduced image signal for image angle displacements. The hologram image processor 27 also converts the reproduced image signal into a binary signal having two white and black values if the reproduced image signal output from the imager 5 represents gradation image data. This is because the data to be read from the hologram memory 3 are two-dimensional page data as two white and black values converted from the original recorded data.

The signal processor 28 performs a decoding process and an error-correcting process on the binary reproduced image signal representing a two-dimensional image pattern, thereby producing the original data. Specifically, the signal processor 28 generates a single data block BLD as shown in FIG. 2C from a reproduced image signal representing a single two-dimensional image. The signal processor 28 generates a sequence of data blocks BLK from reproduced image signals representing respective two-dimensional page dada images stored in the DRAM 24, and arranges the data blocks BLK in the order of addresses to generate the recorded original data, e.g., computer data or AV contents data. The signal processor 28 may compress or expand the computer data or AV contents data, encode the computer data or AV contents data for transmission or recording, or decode the computer data or AV contents data that have been encrypted.

The data generated by the signal processor 28 are transferred as reproduced data from the hologram memory 3 through an external interface 26 to an external device 100 such as a personal computer, an AV device such as an audio player or a video player, or a cellular phone. The external interface 26 may be a USB interface or an interface according to standards other than the USB standards. The user can use the reproduced data from the hologram memory 3 through the external device 100. For example, the user may use computer data on a personal computer or may reproduce AV contents data on an AV device or a cellular phone.

A medium drive for recording data on a certain recording medium may be connected to the hologram reader 20, and the reproduced data obtained by the signal processor 28 may be recorded on the recording medium by the medium drive. The recording medium may be an optical disc, a magnetooptical disc, or the like. For example, the recording medium may be recordable discs according to various formats including a CD (Compact Disc) format, a DVD (Digital Versatile Disc) format, Blu-Ray Disc format, an MD (Mini Disc) format, etc. If any of the discs of these types are used as the recording discs, then the medium drive performs an encoding process, an error-correcting code process, a compression process, etc. depending on the discs on audio data and records the processed audio data on the discs. The recording disc may also be a hard disc. If the recording disc is a hard disc, then the medium drive includes an HDD (Hard Disc Drive). The recording disc may alternatively be a portable memory card with a built-in solid-state memory or a built-in solid-state memory. If the recording disc is such a portable memory card or a built-in solid-state memory, then the medium drive includes a recording unit for recording data in a portable memory card or a built-in solid-state memory. The medium drive processes audio data according to necessary signal processing processes and records the processed audio data in the portable memory card or the built-in solid-state memory.

The hologram reader 20 may also have an audio data reproducing and outputting system and a video data reproducing and outputting system for decoding and outputting AV contents data that have been reproduced from a recording medium by the medium drive. Audio data reproduced by the medium drive may be transferred through the external interface 26 to the external device. If the reproduced data are recorded in a portable recording medium such as a CD, a DVD, a Blu-Ray disc, an MD, a memory card, or the like, then the recording medium may be played on the external device for the user to use the reproduced data read from the hologram memory 3.

[4. Reproducing Operation on Hologram Memory]

The hologram reader 20 performs the reproducing process described above with reference to FIGS. 5A and 5B. The hologram reader 20 controls the reference light sources 7A, 7B for emitting reproducing reference beams L4A, L4B to the element holograms 8A, 8B in the hologram memory 3 at suitable times and also controls the imager 5 to read a reproduced image signal. Details of the reproducing process performed by the hologram reader 20 will be described below.

Figure 8:
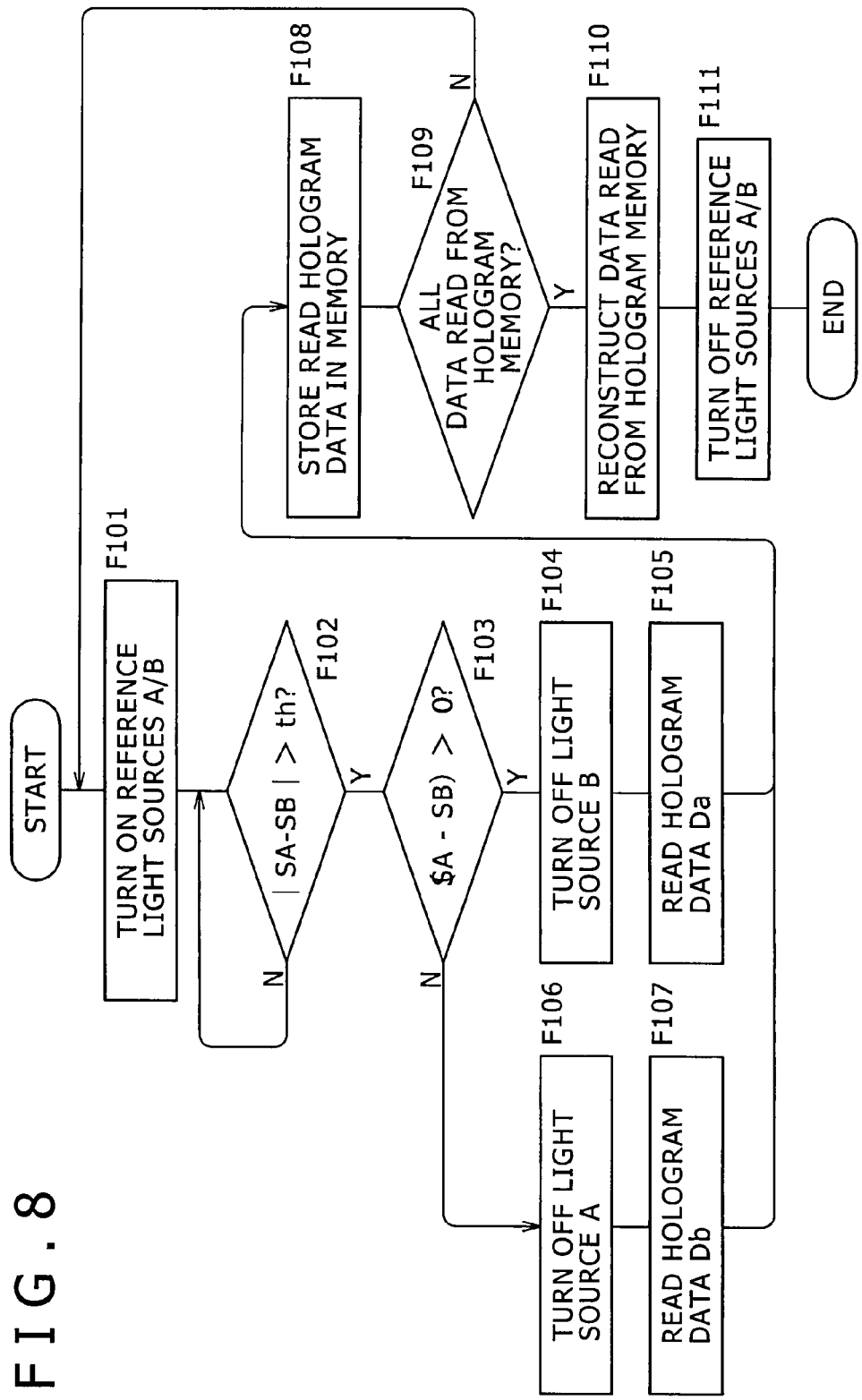
FIG. 8 is a flowchart of a reproducing sequence of the hologram reader according to the embodiment.
Figure 9A:
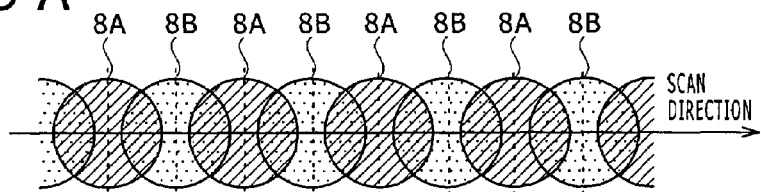
FIG. 9A is a schematic view of a linear array of element holograms to be reproduced by the hologram reader according to the embodiment.

FIG. 8 shows a reproducing sequence of the hologram reader 20, i.e., the system controller 21, for reading recorded data from the hologram memory 3, and FIGS. 9A through 9H show a linear array of element holograms and signal waveforms produced in the reproducing sequence. As shown in FIG. 9A, the element holograms 8A, 8B are recorded in partly overlapping relation in the hologram memory 3 according to the process described above with reference to FIGS. 2, 3A, 3B. The hologram reader 20 alternately scans the element holograms 8A, 8B recorded in the hologram memory 3 in the scanning direction shown in FIG. 9A.

In the present embodiment, the scanning operation of the hologram reader 20 is not limited to any specific process, but may be performed according to various processes. For example, the hologram reader 20 may have a loading mechanism for loading the hologram memory 3, and may also have a scanning mechanism for moving the collimator lens 4 and the imager 5 with respect to the hologram memory 3 loaded by the loading mechanism. Alternatively, the hologram reader 20 may move the hologram memory 3 with respect to a fixed reading position provided by the collimator lens 4 and the imager 5. Further alternatively, the hologram reader 20 may be constructed as a small-size device, and the user may hold the hologram reader 20 by hand and move the hologram reader 20 over the surface of the hologram memory 3. In any of these scanning schemes, the reading position provided by the collimator lens 4 and the imager 5 for reading a reproduced image is moved over the element holograms 8A, 8B as shown in FIG. 9A.

Figure 9B:
FIG. 9B is a diagram showing a signal produced as an image signal at the upper left corner of a reproduced image on an imager 5 when the hologram reader according to the embodiment operates to reproduce the element holograms.
Figure 9C:
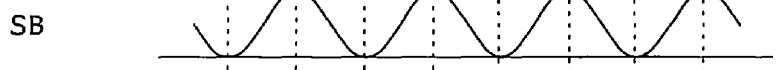
FIG. 9C is a diagram showing a signal produced as an image signal at the lower left corner of the reproduced image on the imager 5 when the hologram reader according to the embodiment operates to reproduce the element holograms.

A signal SA shown in FIG. 9B is a signal that is obtained as an image signal from the upper left corner of the reproduced image by the imager 5. A signal SB shown in FIG. 9C is a signal that is obtained as an image signal from the lower left corner of the reproduced image by the imager 5. Therefore, the signal SA is an image signal (reproduced image signal) representing the white area Wa of the data Da shown in FIG. 2A and the black area Bb of the data Db shown in FIG. 2B as identification marks, and the signal SB is an image signal (reproduced image signal) representing the black area Ba of the data Da shown in FIG. 2A and the white area Wb of the data Db shown in FIG. 2B as identification marks. A differential signal (SA−SB) shown in FIG. 9D is a signal that is generated by the computing unit 32 as representing the difference between the signals SA, SB.

The process of the system controller 21 for reading recorded data from the hologram memory 3 will be described below with reference to the flowchart shown in FIG. 8. The system controller 21 instructs the light emission driver 30 to turn on the reference light sources 7A, 7B for emitting reproducing reference beams L4A, L4B to the hologram memory 3 in step F101. While the hologram memory 3 is being irradiated with both the reproducing reference beams L4A, L4B, the imager 5 detects reproduced images from both the element holograms 8A, 8B.

Figure 9D:
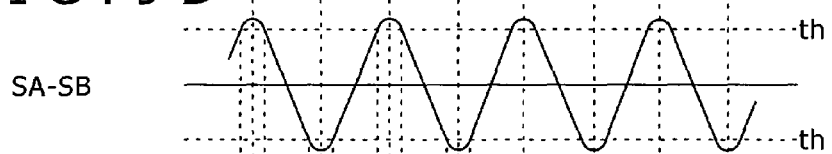
FIG. 9D is a diagram showing a signal produced as the difference between the signal shown in FIG. 9B and the signal shown in FIG. 9C when the hologram reader according to the embodiment operates to reproduce the element holograms.

The signals SA, SB and the differential signal (SA−SB) that are generated at this time are shown in FIGS. 9B, 9C, 9D, respectively. As shown in FIG. 2A, the data Da, i.e., the reproduced image of the element hologram 8A, has the white area Wa at the upper left corner thereof, and the imager 5 detects a high-level (white-level) image signal from the white area Wa which is a high-luminance area. As shown in FIG. 2B, the data Db, i.e., the reproduced image of the element hologram 8B, has the black area Bb at the upper left corner thereof, and the imager 5 detects a low-level (black-level) image signal from the black area Bb which is a low-luminance area.

As the element holograms 8A, 8B are successively scanned as shown in FIG. 9A, the upper left corner of the reproduced image changes from a white image to a mixed white and black image to a black image to a mixed white and black image to a white image, . . . . Specifically, a whitest image is generated at the center of an element hologram 8A, and a blackest image is generated at the center of an element hologram 8B. The signal SA represents a succession of such white, mixed white and black, and black images. Similarly, the lower left corner of the reproduced image changes from a black image to a mixed white and black image to a white image to a mixed white and black image to a black image, . . . . Specifically, a blackest image is generated at the center of an element hologram 8A, and a whitest image is generated at the center of an element hologram 8B. The signal SB represents a succession of such black, mixed white and black, and white images.

The differential signal (SA−SB) generated by the computing unit 32 is supplied to the system controller 21. The system controller 21 compares the absolute value of the differential signal (SA−SB) with a threshold value th in step F102. If |SA−SB|>th, then control goes to step F103. In step F103, the system controller 21 determines whether the differential signal (SA−SB) is of a positive value or a negative value. If the differential signal (SA−SB) is of a positive value, then control goes to step S104 in which the system controller 21 turns off the reference beam source 7B and turns on only the reference beam source 7A to apply the reference beam L4A to the hologram memory 3. In step F105, the system controller 21 controls the hologram scan controller 22 to read a reproduced image signal generated from the imager 5 only during the period of the reference beam L4A as the reproduced image signal of the element hologram 8A (data Da). If the differential signal (SA−SB) is of a negative value, then control goes to step S106 in which the system controller 21 turns off the reference beam source 7A and turns on only the reference beam source 7B to apply the reference beam L4B to the hologram memory 3. In step F107, the system controller 21 controls the hologram scan controller 22 to read a reproduced image signal generated from the imager 5 only during the period of the reference beam L4B as the reproduced image signal of the element hologram 8B (data Db).

The reproduced image signal read in step F105 or F107 is processed by the hologram scan controller 22, and then stored in the DRAM 24 in step F108. In step F109, the system controller 21 determines whether the reading of reproduced image signals representing two-dimensional page data from all the element holograms has been completed or not. If not completed, then control goes back to step F101 to continue the scanning operation. When the reading of reproduced image signals from all the element holograms has been completed, the reading of all the data blocks BLK shown in FIG. 2C has been completed. If one data block BLK is recorded as one element hologram in the hologram memory 3, then when the reading of the element hologram in step F105 or F107 is completed, it is judged in step F109 that the reading of a reproduced image signal from the element hologram has been completed. According to a certain recording format, one data block BLK may be recorded as a plurality of element blocks. Specifically, a plurality of element blocks each representing the same data may be recorded in the hologram memory 3. Such a recording format may be employed to improve the reproduction reliability and increase the reliability of the scanning operation. In such a case, it may be judged in step F109 that the reading process has been completed before all the element holograms are read. Consequently, when the reproduced image signals of all the data blocks BLK as shown in FIG. 2C have been read, it is judged in step F109 that the reading process has been completed.

When the reading process has been completed, the system controller 21 reconstructs the data read from the hologram memory 3. Specifically, the system controller 21 controls the hologram image processor 27 and the signal processor 28 to process the reproduced image signals of all the data blocks BLK to reconstruct the recorded original data. In step F111, the system controller 21 instructs the light emission driver 30 to turn off the reference light sources 7A, 7B for terminating the emission of the reproducing reference beams L4A, L4B. The process of reading recorded data from the hologram memory 3 is put to an end.

Figure 9E:
FIG. 9E is a diagram showing times at which a reference beam is applied at a first angle when the hologram reader according to the embodiment operates to reproduce the element holograms.

The timing to read data in steps F105, F107 will be described below with reference to FIGS. 9A through 9H. A period AB shown in FIG. 9G is a period in which both the reference light sources 7A, 7B are turned on after step F101. The differential signal (SA−SB) representing the difference between the signals SA, SB shown in FIGS. 9B and 9C is illustrated in FIG. 9D. The absolute value |SA−SB| of the differential signal (SA−SB) is greater than the threshold value th in step F102 during the period in which the differential signal (SA−SB) exceeds either a positive threshold value th or a negative threshold value th shown in FIG. 9D.

Figure 9F:
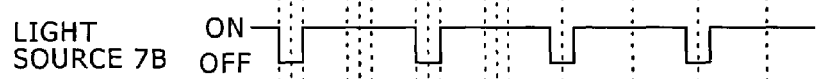
FIG. 9F is a diagram showing times at which a reference beam is applied at a second angle when the hologram reader according to the embodiment operates to reproduce the element holograms.
Figure 9G:
FIG. 9G is a diagram showing times at which reference beams are applied when the hologram reader according to the embodiment operates to reproduce the element holograms.
Figure 9H:
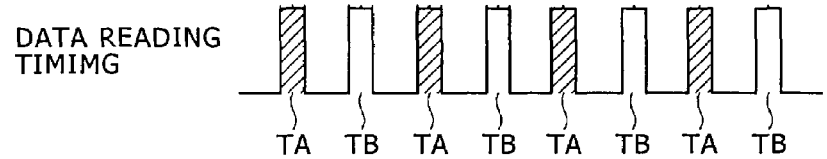
FIG. 9H is a diagram showing times at which data is read when the hologram reader according to the embodiment operates to reproduce the element holograms.

If the differential signal (SA−SB) is of a positive value in step F103, i.e., during the period in which the differential signal (SA−SB) exceeds the positive threshold value th shown in FIG. 9D, the reference beam source 7B is turned off as shown in FIG. 9F, and the hologram memory 3 is irradiated with only the reproducing reference beam L4A from the reference beam source 7A during a period A shown in FIG. 9G. As can be seen from FIGS. 9A, 9E, 9F, 9G, the period A is a period in which the center of the beam spot SPA of the reference beam L4A as it moves in the scanning direction is substantially aligned with the center of an element hologram 8A, i.e., the state shown in FIG. 5A is present. Therefore, as shown in FIG. 9H, the system controller 21 supplies a data reading timing signal TA to the hologram scan controller 22 during the period A to read a reproduced image signal generated at the time as the reproduced image signal from the element hologram 8A. During the period A, since the reference beam L4B is turned off, no image signal is generated from the element hologram 8B that is covered by the spot SPA of the reproducing reference beam L4A. At this time, the spot SPA is not applied to element holograms 8A other than the element hologram 8A which is being irradiated. During the period A, therefore, only a reproduced image from the single element hologram 8A irradiated with the spot SPA is detected by the imager 5. When the reproduced image signal from the imager 5 is read during the period A in step F105, it is obtained as the reproduced image signal from the element hologram 8A with no or little crosstalk from the other element holograms 8B, 8A.

If the differential signal (SA−SB) is of a negative value in step F103, i.e., during the period in which the differential signal (SA−SB) exceeds the negative threshold value th shown in FIG. 9D, the reference beam source 7A is turned off as shown in FIG. 9E, and the hologram memory 3 is irradiated with only the reproducing reference beam L4B from the reference beam source 7B during a period B shown in FIG. 9G. As can be seen from FIGS. 9A, 9E, 9F, 9G, the period B is a period in which the center of the beam spot SPB of the reference beam L4B as it moves in the scanning direction is substantially aligned with the center of an element hologram 8B, i.e., the state shown in FIG. 5B is present. Therefore, as shown in FIG. 9H, the system controller 21 supplies a data reading timing signal TB to the hologram scan controller 22 during the period B to read a reproduced image signal generated at the time as the reproduced image signal from the element hologram 8B. During the period B, since the reference beam L4A is turned off, no image signal is generated from the element hologram 8A that is covered by the spot SPB of the reproducing reference beam L4B. At this time, the spot SPB is not applied to element holograms 8B other than the element hologram 8B which is being irradiated. During the period B, therefore, only a reproduced image from the single element hologram 8B irradiated with the spot SPB is detected by the imager 5. When the reproduced image signal from the imager 5 is read during the period B in step F107, it is obtained as the reproduced image signal from the element hologram 8B with no or little crosstalk from the other element holograms 8A, 8B.

As described above, the hologram reader 20 can read high-quality reproduced signals of the element holograms 8A, 8B from the hologram memory 3 in which the element holograms 8A, 8B are successively recorded such that adjacent ones of the element holograms 8A, 8B overlap each other in the overlapping area W (see FIGS. 3A, 3B) and have the respective unoverlapping areas NWa, NWb (see FIGS. 3A, 3B). Since the differential signal (SA−SB) functioning as a servo signal is obtained from white and black areas serving as identification marks in reproduced images of the element holograms 8A, 8B, and scanning times are detected based on the differential signal (SA−SB), no complex arrangement is needed to control the timing to read data. Furthermore, as scanning times are detected from the reproduced images of the element holograms 8A, 8B, the relative movement of the collimator lens 4 and the imager 5, and the hologram memory 3 is not required to be accurate during the scanning operation. Therefore, a scanning process in which the user holds the hologram reader 20 by hand and moves the hologram reader 20 over the surface of the hologram memory 3 may be employed.

Accordingly, the hologram reader 20 is of a simple structural arrangement and has a stable data reproducing capability. The hologram reader 20 is suitable for use in a system wherein computer data and AV contents data are recorded in the hologram memory 3, such hologram memories 3 are widely distributed, and the general user acquires the data recorded in the hologram memory 3 using the hologram reader 20.

In the embodiment shown in FIGS. 7, 8, 9A through 9H, the components recited in the claims for a reproducing apparatus according to the present invention correspond to the following parts or processing functions: A reference beam applying means corresponds to the reference light sources 7A, 7B and the light emission driver 30. A reproduced image detecting means corresponds to the imager 5. A signal reading means corresponds to the hologram scan controller 22 and the DRAM 24. A reproducing means corresponds to the hologram image processor 27 and the signal processor 28. A timing detecting means corresponds to the computing unit 32 and processing functions represented by steps F101, F102, F103 performed by the system controller 21 on the differential signal (SA−SB). A control means corresponds to processing functions represented by steps F104 through F108 performed by the system controller 21. Steps recited in the claims for a reproducing method according to the present invention correspond to the following processing functions: Timing detecting step corresponds to steps F101, F102, F103. Reproduced signal reading step corresponds to steps F104 through F108. Reproducing step corresponds to step F110.

In the above embodiment, the hologram reader 20 reads data from the hologram memory 3 in which the element holograms 8A, 8B are recorded as shown in FIGS. 3A and 3B. However, the principles of the present invention are also applicable to a hologram reader for reading data from the hologram memory 3 in which the element holograms 8A, 8B, 8C, 8D are recorded as shown in FIGS. 6A through 6C. Such a hologram reader has four reference beam sources for applying respective reference beams to the hologram memory 3 at the same angles as the recording reference beams applied to record the respective element holograms 8A, 8B, 8C, 8D. The scanning times may be determined using reproduced image signals representing identification marks of the data Da, Db, Dc, Dd shown in FIG. 6C.

The reproducing apparatus (hologram reader) is not limited to the arrangement shown in FIG. 7. The data reproduced from the hologram reader 20 may be output in various forms. The hologram memory 3 may be sold and provided itself to the user in the form of package mediums such as CDs and DVDs which are generally distributed at present, as mediums for providing computer data, AV contents data, etc. Alternatively, the hologram memory 3 may be attached to or printed on posters, books, etc., and the user may obtain various recorded data therefrom using the hologram reader.

Although certain preferred embodiments of the present invention have been shown and described in detail, it should be understood that various changes and modifications may be made therein without departing from the scope of the appended claims.

What is claimed is:

1. An apparatus for reproducing data from a recording medium, said apparatus comprising:
    a first reproducing reference beam source configured to apply a first reproducing reference beam to said recording medium at a first angle;
    a second reproducing reference beam source configured to apply a second reproducing reference beam to said recording medium at a second angle,
    wherein said recording medium includes a first element hologram formed by interference fringes generated by interference between a first data object beam and a first recording reference beam applied at the first angle, and a second element hologram formed on the recording medium by interference fringes generated by interference between a second data object beam and a second recording reference beam applied at the second angle, the second angle being different from the first angle, and the second element hologram partly overlapping the first element hologram;
    a reproduced image detecting section configured to detect hologram images reproduced from said recording medium irradiated with the reproducing reference beams and outputting reproduced image signals representing said hologram images, wherein each of said reproduced image signals representing adjacent element holograms which are disposed in an overlapping relation have a first identifier and a second identifier;
    an identifier detecting section configured to detect the first identifier and the second identifier in each of said reproduced image signals, to generate a first identifier signal from successive first identifiers detected by the identifier detecting section, and to generate a second identifier signal from successive second identifiers detected by the identifier detecting section;
    a comparator configured to determine a difference between the first identifier signal and the second identifier signal;
    a signal reading section configured to read the reproduced image signals representing said hologram images detected by said reproduced image detecting section, and to store the reproduced image signal in a memory device;
    a timing detecting section configured to detect scanning times for scanning the element holograms recorded in said recording medium from the reproduced image output from said reproduced image detecting section when said recording medium is irradiated with the reproducing reference beams at one of said first angle and said second angle; and
    a control section configured to control each of said first and second reproducing reference beam sources to apply the reproducing reference beams at the respective angles corresponding to the element holograms at the scanning times detected by said timing detecting section based on the difference between the first identifier signal and the second identifier signal, and controlling said reproduced image detecting section to detect and reproduce said hologram images from said recording medium in response to the applied reference beams.

2. The apparatus according to claim 1, wherein said timing detecting section detects scanning times based on the first and second identifiers detected by said identifier detecting section.

3. The apparatus according to claim 2, wherein said identifier detecting section detects said first and second identifiers based on a brightness level in a predetermined area of reproduced images corresponding to each of said reproduced image signals.

4. The apparatus according to claim 3, wherein said identifier detecting section detects said first and second identifiers based on a combination of brightness levels in a plurality of predetermined areas of reproduced images corresponding to each of said reproduced image signals.

5. A method of reproducing data from a recording medium executed by a hologram reproducing apparatus, the method comprising:
applying a first reproducing reference beam to said recording medium at a first angle with a first reproducing reference beam source;
applying a second reproducing reference beam to said recording medium at a second angle with a second reproducing reference beam source,
wherein said recording medium includes a first element hologram formed by interference fringes generated by interference between a first data object beam and a first recording reference beam applied at the first angle, and a second element hologram formed on the recording medium by interference fringes generated by interference between a second data object beam and a second recording reference beam applied at the second angle, the second angle being different from the first angle, and the second element hologram partly overlapping the first element hologram;
detecting, with a image detecting device at the hologram reproducing apparatus, hologram images reproduced from said recording medium irradiated with the reproducing reference beams and outputting reproduced image signals representing said hologram images, wherein each of said reproduced image signals representing adjacent element holograms which are disposed in an overlapping relation having a first identifier and a second identifier;
detecting, with an identifier detecting section at the hologram reproducing apparatus, the first identifier and the second identifier in each of said reproduced image signals, generating a first identifier signal from successive first identifiers detected by the identifier detecting section, and generating a second identifier signal from successive second identifiers detected by the identifier detecting section;
comparing, with a comparator at the hologram reproducing apparatus, a difference between the first identifier signal and the second identifier signal;
reading, with a signal reading section at the hologram reproducing apparatus, the reproduced image signals representing said hologram images, each of the reproduced image signals representing adjacent element holograms which are disposed in overlapping relation has an identifier for identifying each of the adjacent element holograms;
storing the reproduced image signal in a memory device at the hologram reproducing apparatus;
detecting, with a timing detecting section at the hologram reproducing apparatus, scanning times for scanning the element holograms recorded in said recording medium from the reproduced image signals;
controlling, with a control section at the hologram reproducing apparatus, each of said first and second reproducing reference beam sources to apply the reproducing reference beams at the respective angles corresponding to the element holograms at the scanning times detected by said timing detecting section based on the difference between the first identifier signal and the second identifier signal; and
controlling, with the control section at the hologram reproducing apparatus, said reproduced image detecting section to detect and reproduce said hologram images from said recording medium in response to the applied reference beams.

6. The method according to claim 5, wherein said detecting scanning times includes detecting the scanning times based on said first and second identifiers.

7. The method according to claim 6, wherein said detecting said first and second identifiers includes detecting said first and second identifiers based on a brightness level in a predetermined area of reproduced images corresponding to each of said reproduced image signals.

8. The method according to claim 7, wherein said detecting said first and second identifiers includes detecting said first and second identifiers based on a combination of brightness levels in a plurality of predetermined areas of reproduced images corresponding to each of said reproduced image signals.

9. The apparatus of claim 1, wherein
the reproduced image detecting section includes a CMOS image sensor or a CCD image sensor,
the signal reading section includes the memory device and a hologram scan controller, and
the control section includes a memory controller and a system controller.

10. The method of claim 5, wherein
the image detecting device includes a CMOS image sensor or a CCD image sensor,
the signal reading section includes the memory device and a hologram scan controller, and
the control section includes a memory controller and a system controller.

* * * * *